United States Patent
Lee et al.

(10) Patent No.: US 6,876,062 B2
(45) Date of Patent: Apr. 5, 2005

(54) SEAL RING AND DIE CORNER STRESS RELIEF PATTERN DESIGN TO PROTECT AGAINST MOISTURE AND METALLIC IMPURITIES

(75) Inventors: Tze-Liang Lee, Hsinchu (TW); Shih-Chung Chen, Taoyuan (TW); Ming-Soah Liang, Hsinchu (TW); Chen-Hua Yu, Hsin-chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 316 days.

(21) Appl. No.: 10/185,192

(22) Filed: Jun. 27, 2002

(65) Prior Publication Data

US 2004/0002198 A1 Jan. 1, 2004

(51) Int. Cl.[7] .......................... H01L 29/06; H01L 23/58; H01L 23/34; H01P 3/08
(52) U.S. Cl. ...................... 257/622; 257/623; 257/626; 257/632; 257/698; 257/728; 333/246; 333/260
(58) Field of Search .................... 257/622, 623, 257/626, 632, 698, 728; 333/246, 268, 26, 260

(56) References Cited

U.S. PATENT DOCUMENTS

| 6,028,347 A | * | 2/2000 | Sauber et al. | 257/622 |
| 6,028,497 A | * | 2/2000 | Allen et al. | 333/246 |
| 2002/0157082 A1 | * | 10/2002 | Shau | 716/19 |

\* cited by examiner

Primary Examiner—John F. Niebling
Assistant Examiner—Ron Pompey
(74) Attorney, Agent, or Firm—Tung & Associates

(57) ABSTRACT

An apparatus and method for protecting die corners in a semiconductor integrated circuit. At least one irregular seal ring having two sides can be configured, wherein the irregular seal ring is located at a corner of a die utilized in fabricating a semiconductor integrated circuit. A dummy configuration for stress relief can then be arranged, wherein the dummy configuration is located at the two sides of the at least one irregular seal ring, thereby protecting the corner of the die against thermal stress and the semiconductor integrated circuit against moisture and metallic impurities. The irregular seal ring can be configured to generally comprise a non-rectangular seal ring. The irregular seal preferably comprises an octangular seal ring.

8 Claims, 2 Drawing Sheets

SEAL RING AND DIE CORNER STRESS RELIEF PATTERN DESIGN TO PROTECT AGAINST MOISTURE AND METALLIC IMPURITIES

TECHNICAL FIELD

The present invention relates generally to semiconductor fabrication techniques and devices thereof. The present invention also relates to seal rings utilized in the fabrication of semiconductor integrated circuits. The present invention additionally relates to methods and devices for preventing thermal stress during the fabrication of semiconductor integrated circuits.

BACKGROUND OF THE INVENTION

Because of recent technological advancements in the fields of computers and telecommunications, there has been a substantial increase in demand for "high tech" products. Not only do consumers want more sophisticated computer, telecommunication and other "high-tech" systems, they want it at a more economical costs. Because of this consumer desire, high tech industries are gearing their manufacturing techniques to produce products that are made as economical as possible, with improved performance and reliability.

One of the backbone industries supporting many high tech industries, including the computer and telecommunication fields, involves the manufacturing of semiconductor wafers. Semiconductor wafers are used extensively for the manufacturing of integrated circuits, semiconductor devices, and other circuits and/or components. The manufacturing of an integrated circuit or device typically comprises several manufacturing stages, including processing the semiconductor wafer to form the desired circuits and/or devices, forming a metal seed layer on the base plate of the semiconductor, plating the seed layer with another metal layer having a desired thickness, and dicing the wafers in order to form separate integrated circuits and/or components.

In the production of semiconductor integrated circuits utilizing semiconductor wafers, it is often necessary to utilizes dies in association with seal rings. Such dies and seal rings are well known in the art. Prior art seal rings are commonly rectangular or square shaped and are utilized for moisture protection. One of the problems that such seal rings face is the stress that mounts at the corners of such dies, particularly involving low-K IMD (intermetal dielectric) based devices. The present inventors thus have concluded, based on the foregoing, that a need exists for an improved seal ring that can reduce or prevent such thermal stress issues encountered at die corners. The present inventors believe that the improved seal ring structure and die corner dummy pattern disclosed herein can solve the problems faced by prior art methods and devices.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

It is therefore one aspect of the present invention to provide an improved semiconductor fabrication apparatus and method.

It is another aspect of the present invention to provide an apparatus and method for protecting the corners of dies utilized in the fabrication of semiconductor integrated circuits.

It is yet another aspect of the present invention to provide an apparatus and method for resolving thermal stress issues associated with die corners in the fabrication of semiconductor integrated circuits.

It is still another aspect of the present invention to provide an irregular seal ring that can be utilized to protect die corners against thermal stress, moisture and metallic impurities.

It is also an aspect of the present invention to provide an octangular seal ring that can be utilized to protect die corners against thermal stress moisture and metallic impurities.

It is still a further aspect of the present invention to provide a die corner dummy pattern or configuration for stress relief.

The above and other aspects of the present invention can thus be achieved as is now described. An apparatus and method for protecting die corners in a semiconductor integrated circuit are disclosed herein. According to the apparatus and method of the present invention, at least one irregular seal ring having two sides can be configured, wherein the irregular seal ring is located at a corner of a die utilized in fabricating a semiconductor integrated circuit. A dummy configuration for stress relief can then be arranged, wherein the dummy configuration is located at the two sides of the at least one irregular seal ring, thereby protecting the corner of the die against thermal stress and the semiconductor integrated circuit against moisture and metallic impurities.

The irregular seal ring can be configured to generally comprise a non-rectangular seal ring. The irregular seal preferably comprises an octangular seal ring. The dummy configuration generally comprises a die corner dummy pattern, which is based on the utilization of at least one dummy metal. The irregular seal ring generally comprise a minor seal ring and/or a major seal ring. The dummy configuration is generally based on a two dimensional metal mesh pattern. The dummy configuration can also be arranged based on a triangular die corner dummy pattern. Thus, an octangular seal ring can be configured and utilized to resolve thermal stress issues and achieve package level reliability. Additionally, such an octangular seal ring in association with a die corner dummy pattern can achieve moisture protection and stress relief for die corners utilized in the fabrication of a semiconductor integrated circuit.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate embodiments of the present invention and are not intended to limit the scope of the invention.

Figure 1:
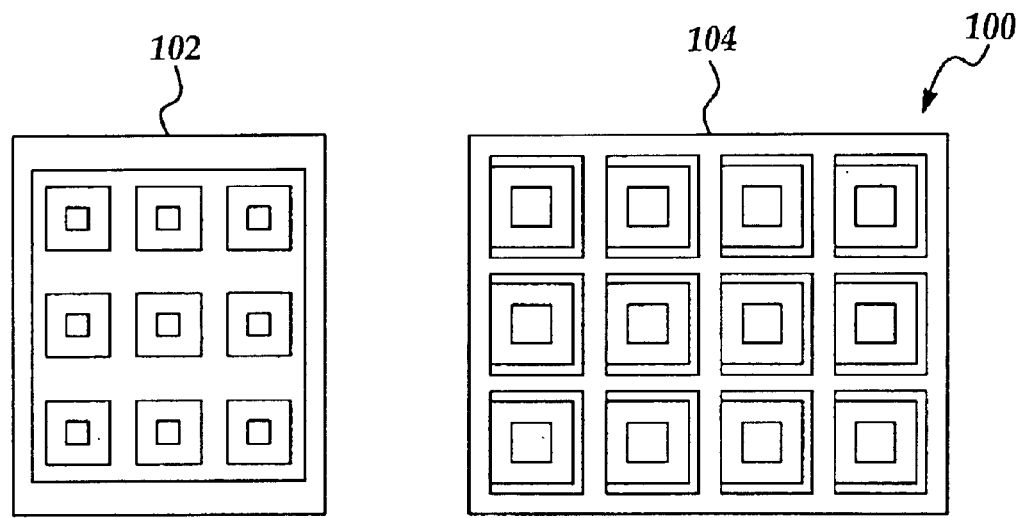
FIG. 1 depicts a block diagram illustrating a prior art seal ring configuration in comparison with a seal ring configuration, which can be implemented in accordance with the apparatus and method of the present invention.

FIG. 1 depicts a block diagram 100 illustrating a prior art seal ring configuration 102 in comparison with a seal ring configuration 104, which can be implemented in accordance with the apparatus and method of the present invention. A seal ring plays a key role in achieving better performance of chip corner delaminating. Seal ring configuration 102 generally does not perform as well as seal ring configuration 104. Seal ring configuration 102 is generally rectangular or square shaped and does not properly address thermal stress issues that can accrue at the corners of dies utilized in the fabrication of semiconductor integrated circuits.

Figure 2:
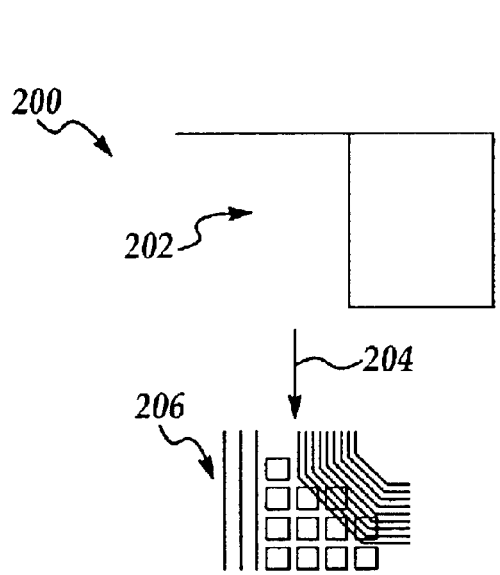
FIG. 2 illustrates a block diagram illustrating a prior art rectangular seal configuration.

FIG. 2 illustrates a block diagram 200 illustrating a prior art rectangular seal configuration 202. An arrow 204 indicates a close-up view 206 of rectangular seal configuration 202. The arrangement illustrated in FIG. 2 thus generally illustrates a rectangular seal ring structure, which is commonly used for moisture protection. Such a structure, including the prior art seal ring configuration 102 depicted in FIG. 1 however, are not sufficient for low-K IMDs (i.e., intermetal dielectric) to protect against die corner stress. The configuration depicted in FIG. 2 stands in contradistinction to the configuration depicted in FIG. 3.

Figure 3:
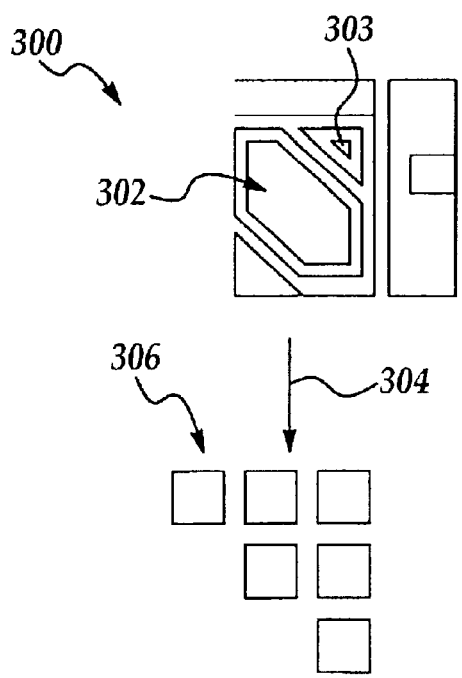
FIG. 3 depicts a block diagram illustrating an octangular seal ring and triangle die corner dummy pattern, which can be implemented in accordance with a preferred embodiment of the present invention.

FIG. 3 depicts a block diagram 300 illustrating an octangular seal ring 302 and an associated triangle die corner dummy pattern 303, which can be implemented in accordance with a preferred embodiment of the present invention. An arrow 304 indicates a close-up view 306 of an octangular seal ring structure. Die corner dummy pattern 303 can be located at both sides of the octangular seal ring corner 302. The utilization of an octangular (i.e., irregular or non-rectangular) shaped seal ring thus prevents thermal stress at the corners of dies utilized in the fabrication of semiconductor integrated circuits.

Figure 4:
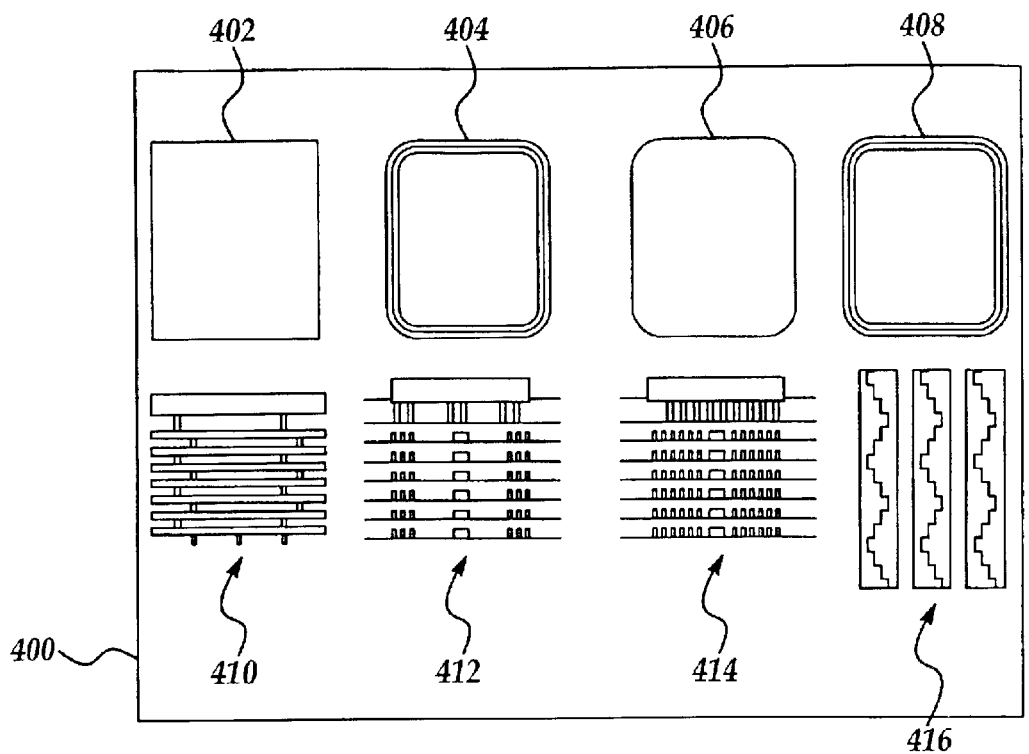
FIG. 4 illustrates a block diagram of seal ring types which can be implemented in accordance with alternative embodiments of the present invention.

FIG. 4 illustrates a block diagram 400 of seal ring types, which can be implemented in accordance with alternative embodiments of the present invention. Seal ring types 402, 404, 406, and 408 are indicated in block diagram 400 of FIG. 4. In addition cross sections 410, 412, 414, and top view 416 are illustrated in block diagram 400 of FIG. 4.

Cross section 410 is associated with seal ring type 402, while cross section 412 is associated with seal ring type 404. In addition, cross section 414 is associated with seal ring type 406. Top view 416 is generally associated with seal ring type 408. It can be appreciated that the foregoing seal ring types can be implemented in accordance with the apparatus and method of the present invention, if such seal ring types are configured as octangular seal rings with associated die corner dummy patterns for stress relief.

Figure 5:
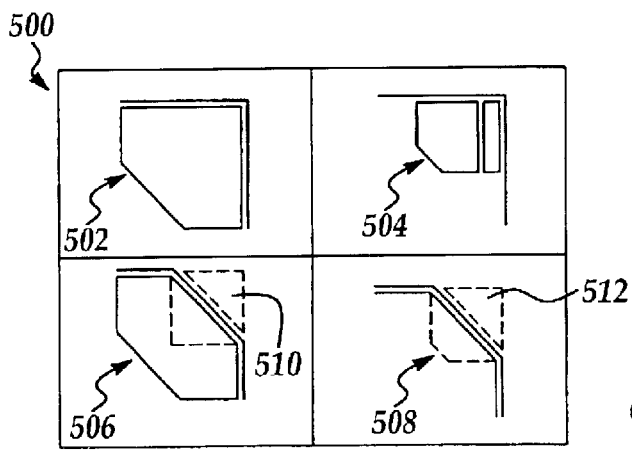
FIG. 5 depicts a block diagram comparing square seal ring configurations to octangular seal ring configurations.

FIG. 5 depicts a block diagram 500 comparing square seal ring configurations 502 and 504 to octangular seal ring configurations 506 and 508. Octangular seal ring configuration 506 is associated with a dummy metal 510. Octangular seal ring configuration 508 is associated with a dummy metal 512. Note that the width and length values (e.g., um) indicated in FIG. 5 are provided for illustrative purposes only and are not considered limiting features of the present invention. Rectangular seal ring configuration 502 and octangular seal ring configuration 506 are generally utilized for larger dies, while rectangular seal ring configuration 504 and octangular seal ring configuration 508 are generally utilized for smaller dies.

Figure 6:
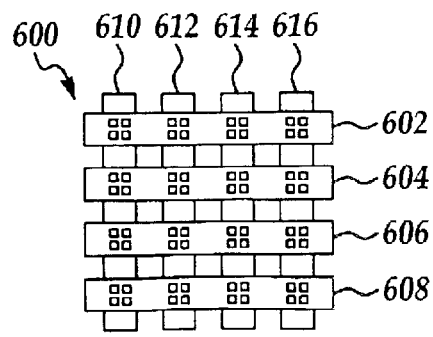
FIG. 6 illustrates a die corner dummy metal pattern that can be implemented in accordance with the apparatus and method of the present invention.

FIG. 6 illustrates a die corner dummy metal pattern 60 that can be implemented in accordance with the apparatus and method of the present invention. Pattern 60 generally includes anchoring vias 602, 604, 606, and 608, which can be composed of metal 1 or metal 2 layers. Similarly, layers 610, 612, 614, and 616 can be composed of metal 1 or metal 2 layers.

Pattern 60 generally is based on a two dimensional metal mesh configuration. Although metal 1 and metal 2 layers are described above, it can be appreciated that such metal types are disclosed herein for illustrative purposes only and are not considered limiting features of the present invention. Regardless of the type of metal utilized in a particular embodiment of the present invention, a two-dimensional metal mesh pattern is preferred when implementing a die corner dummy metal pattern.

Based on the foregoing, it can be appreciated that the present invention generally discloses an apparatus and method for protecting die corners in a semiconductor integrated circuit. According to the apparatus and method of the present invention, at least one irregular seal ring having two sides can be configured, wherein the irregular seal ring is located at a corner of a die utilized in fabricating a semiconductor integrated circuit. A dummy configuration for stress relief can then be arranged, wherein the dummy configuration is located at the two sides of the at least one irregular seal ring, thereby protecting the corner of the die against thermal stress and the semiconductor integrated circuit against moisture and metallic impurities.

The irregular seal ring can be configured to generally comprise a non-rectangular seal ring. The irregular seal preferably comprises an octangular seal ring. The dummy configuration generally comprises a die corner dummy pattern, which is based on the utilization of at least one dummy metal. The irregular seal ring generally comprise a minor seal ring and/or a major seal ring.

The dummy configuration is generally based on a two dimensional metal mesh pattern. The dummy configuration can also be arranged based on a triangular die corner dummy pattern. Thus, an octangular seal ring can be configured and utilized to resolve thermal stress issues and achieve package level reliability. Additionally, such an octangular seal ring in association with a die corner dummy pattern can achieve moisture protection and stress relief for die corners utilized in the fabrication of a semiconductor integrated circuit.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

The description as set forth is thus not intended to be exhaustive or to limit the scope of the invention. Many modifications and variations are possible in light of the above teaching without departing from scope of the following claims. It is contemplated that the use of the present invention can involve components having different characteristics. It is intended that the scope of the present invention be defined by the claims appended hereto, giving full cognizance to equivalents in all respects.

What is claimed is:

1. A device in a semiconductor integrated circuit for protecting die corners, said device comprising:
    at least one irregular seal ring which, comprises an octangular seal ring, having two sides, wherein said at least one irregular seal ring is located at a corner of a die utilized in fabricating a semiconductor integrated circuit; and
    a dummy configuration for stress relief, wherein said dummy configuration is located at said two sides of said at least one irregular seal ring, thereby protecting said corner of said die against thermal stress and said semiconductor integrated circuit against moisture and metallic impurities.

2. A device of claim 1 wherein said dummy configuration comprises a die corner dummy pattern.

3. A device of claim 1 wherein said dummy configuration comprises at least one dummy metal.

4. A device of claim 1 wherein said at least one irregular seal ring comprises a minor seal ring.

5. A device of claim 1 wherein said at least one irregular seal ring comprises a major seal ring.

6. A device of claim 1 wherein said dummy configuration comprises a two dimensional metal mesh pattern.

7. A device of claim 1 wherein said dummy configuration comprises a triangular die corner dummy pattern.

8. A device in a semiconductor integrated circuit for protecting die corners, said apparatus comprising:
    at least one octangular seal ring having two sides, wherein said at least one octangular seal ring is located at a corner of a die utilized in fabricating a semiconductor integrated circuit;
    a die corner dummy pattern for stress relief;
    wherein said die corner dummy pattern is located at said two sides of said at least one octangular seal ring; and
    wherein said die corner dummy pattern comprises a two-dimensional dummy metal mesh pattern, thereby protecting said corner of said die against thermal stress and said semiconductor integrated circuit against moisture and metallic impurities.

* * * * *